United States Patent
Eckl et al.

(10) Patent No.: US 7,810,057 B2
(45) Date of Patent: Oct. 5, 2010

(54) CHARACTERIZING LINEARITY OF AMPLIFIERS

(75) Inventors: Wolfgang Franz Eckl, Spardorf (DE);
Bernd Georg Friedel, Markt Bibart (DE)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 20 days.

(21) Appl. No.: 10/953,892

(22) Filed: Sep. 29, 2004

(65) Prior Publication Data

US 2006/0066394 A1    Mar. 30, 2006

(51) Int. Cl.
*G06F 9/45* (2006.01)
(52) U.S. Cl. .................. 716/4; 330/207 R; 330/200
(58) Field of Classification Search ............ 330/207 R, 330/200; 716/10, 1
See application file for complete search history.

(56) References Cited

U.S. PATENT DOCUMENTS 6,901,571 B1 *   5/2005  Petranovic et al. ............ 716/10

OTHER PUBLICATIONS

International European Search Report EP 04 25 5952 dated Mar. 11, 2005.

* cited by examiner

*Primary Examiner*—Michael B Shingleton
(74) *Attorney, Agent, or Firm*—Williams, Morgan & Amerson

(57) ABSTRACT

The present invention provides a method and an apparatus for assessing a capability, for example, linearity of an amplifier, such as that of a power amplifier including a radio frequency amplifier. In one embodiment, the method comprises defining a first figure of merit for a power amplifier based on a loss of linearity relative to a predefined linearity requirement for the power amplifier and/or defining a second figure of merit based on the first figure of merit and dependent upon a minimum frequency within a predefined frequency band for the power amplifier, characterizing the linearity thereof. In this manner, using a test setup, for digital mobile communication networks deploying one or more higher order modulation schemes with complex wireless transmission that results in non-constant envelope signals, linearity of power amplifiers in transceivers, such as a mobile station or a base station, may be sufficiently described. Moreover, the two defined figures of merit may be used to compare different amplifiers for these higher modulation schemes, making possible a comparison of different amplifiers independent of their implementation technology or design structure.

30 Claims, 8 Drawing Sheets

CHARACTERIZING LINEARITY OF AMPLIFIERS

BACKGROUND OF THE INVENTION

1. Field of the Invention

This invention relates generally to telecommunications, and more particularly, to wireless communications.

2. Description of the Related Art

Growth of wireless communication systems has increased the demand for highly efficient amplifiers, for example, power amplifiers like radio frequency (RF) amplifiers. A power amplifier is an active, two-port device that exhibits both linear and non-linear behavior. Some design parameters for RF power amplifiers include high output power, high linearity, and good efficiency. The linearity of a power amplifier may refer to an ability of an amplifier to amplify an input signal power, over a range of frequencies, equal in amplitude or value and quality without an undesired deviation from a generally linear configuration. Characterizing the linear and non-linear behavior of power amplifiers involves defining the characteristics of power amplifiers, and presenting specific power amplifier requirements. A host of parameters are typically used to specify power amplifier performance. To test power amplifier performance, different test system architectures have been used. For example, amplifier testing is often performed under pulsed RF and pulsed bias conditions when testing unpackaged devices.

Moreover, newer technologies demand transmission of large amounts of data with only a small portion of the spectrum being used. This may be accomplished using sophisticated modulation techniques, leading to wide, dynamic signals that benefit from linear amplification. For instance, some modem wireless applications, such as based on the wideband code division multiple access (WCDMA) standard use non-constant envelope modulation techniques with a high peak-to-average ratio. To attain high data rates and spectral efficiency, these modem wireless communication standards employ non-constant envelope modulation techniques, such as quadrature phase shift keying (QPSK). The RF power amplifiers implemented in such systems are 'backed off' from saturation into a linear operating region to obtain a satisfactory linearity over the transmitter's dynamic range. Therefore, linearity being a critical issue, power amplifiers implemented in such applications are commonly operated at a backed off region from saturation. The non-linearity of a power amplifier can be attributed at least partially to gain compression and harmonic distortions resulting in imperfect reproduction of the amplified signal. This non-linearity may be characterized by various techniques depending upon specific modulation and application. Some of the widely used figures for quantifying linearity are a 1 dB compression point, third order inter-modulation distortion, third order intercept point (IP3), adjacent channel power ratio (ACPR), and error vector magnitude (EVM). A set of "standard" figures of merit that have been used to describe the behavior of amplifiers include parameters, such as a gain, third order intercept point (IP3), 1 dB compression point ($P_{1dB}$) etc. All of these figures of merit are measured using quasi-static signals or in most cases even a constant wave (CW) RF signal without modulation contents. Referring to FIG. 3, for example, a typical characteristic of a radio frequency (RF) amplifier is depicted with the $P_{1dB}$ compression point based on a prior art figure of merit to describe the behavior of the RF amplifier.

In modern mobile communication networks, however, the transmission gets more and more complex using higher order modulation schemes, resulting in non-constant envelope signals. The linearity demands for power amplifiers increase rapidly by applying such signals. So the well-known parameters named before are no longer sufficient to describe the ability of an amplifier.

One parameter of non-constant envelope signals is a long time average power. With a peak-power to average-power ratio (PAR), a reasonable estimate of the nature of a signal may be derived. Because of this PAR, the average-power capability of an amplifier is, of course, less than the $P_{1dB}$ which is a significant measurement obtained with the CW-RF signals. To describe the power handling capability of a power amplifier, a term called "power backoff" is typically used. Because of the PAR, and additionally due to the nonlinearities in the amplifier, the average power of an amplified signal is normally well below the $P_{1dB}$. The maximum average power still fulfilling the linearity specifications like error vector magnitude (EVM) or adjacent channel power ratio (ACPR) is now the upper limit for the amplifier. The power backoff now describes the ratio of the $P_{1dB}$ and this maximum average ratio. Assuming an ideal linear amplifier, the power backoff should be the PAR of a test signal.

However, one disadvantage of the power backoff based figure of merit is the very definition of the $P_{1dB}$ itself. That is, the power backoff based figure of merit is measured under conditions not comparable to that of the test signals used to determine the maximum average power. In fact, this figure of merit cannot be used to effectively compare the capabilities of two different amplifiers.

For example, a comparison of compression behavior of two different amplifiers is shown in FIG. 4. An amplifier 1 has a sharp compression behavior, so the $P_{1dB}$ is high and very close to the maximum possible output power. In contrast, an amplifier 2 has a softer compression behavior, with the $P_{1dB}$ being comparably lower than that of the amplifier 1. Both the amplifiers are assumed to exhibit the same gain for low input power. Assuming that both the amplifiers can deliver the same maximum average power the power backoff is different even the absolute maximum power $P_{max}$ is again the same. So in fact, the two amplifiers are comparable in their behavior but the figure of merit of power backoff presents a completely different and invalid view.

An additional significant drawback of the "standard" figures of merit mentioned earlier is that they are determined by using an unpulsed CW signal. A CW test signal is a sinusoidal signal with a PAR of zero. Thus, the CW test signal has substantially no relationship to the signal that the amplifier has to amplify during field or real world operation. Additionally, an unpulsed measurement at high output levels heats up the amplifier. This heating reduces the maximum output power, the $P_{1dB}$ and the gain of the amplifier. Accordingly, the maximum output power capability of the amplifier for the short peaks of a signal with a non-zero PAR cannot be accurately determined by using unpulsed CW test signals.

The present invention is directed to overcoming, or at least reducing, the effects of, one or more of the problems set forth above.

SUMMARY OF THE INVENTION

In one embodiment of the present invention, a method for assessing a capability of an amplifier includes defining a first figure of merit for a power amplifier based on a loss of linearity relative to a predefined linearity requirement for the power amplifier to characterize linearity of the power amplifier, applying a signal stimulus to the power amplifier to test a loss of linearity of the power amplifier, and measuring the linearity of the power amplifier in response to the signal stimulus to compare the power amplifier with another power amplifier based on the first figure of merit.

In another embodiment, an apparatus comprises a test setup to assess a capability of an amplifier. A power amplifier may be coupled to the test setup, wherein the test setup defines a first figure of merit for the power amplifier based on a loss of linearity relative to a predefined linearity requirement for the power amplifier to characterize linearity of the power amplifier and the power amplifier amplifies a complex modulated signal for a wireless communication, applies a signal stimulus to the power amplifier to test a loss of linearity of the power amplifier, and measures the linearity of the power amplifier in response to the signal stimulus to compare the power amplifier with another power amplifier based on the first figure of merit.

In yet another embodiment, an amplifier that amplifies a complex modulated signal to provide a desired output power level for a wireless communication comprises an input test interface coupled to the amplifier to receive a signal stimulus to test a loss of linearity of the amplifier and an output test interface coupled to the amplifier to measure the linearity of the amplifier in response to the signal stimulus to compare the amplifier with another amplifier based on the loss of linearity of the amplifier.

In still another embodiment, a telecommunication system comprises a transceiver having a power amplifier that amplifies a complex modulated signal to provide a desired output power level for a wireless communication, wherein for the power amplifier a first figure of merit is defined based on a loss of linearity relative to a predefined linearity requirement for the power amplifier to characterize linearity of the power amplifier, a signal stimulus is applied to the power amplifier to test a loss of linearity of the power amplifier, and the linearity of the power amplifier is measured in response to the signal stimulus to compare the power amplifier with another power amplifier based on the first figure of merit.

In a further embodiment of the present invention, a method is provided for testing a capability of a first and a second power amplifier each of which configured to transmit an input signal modulated using a higher modulation scheme. The method includes defining a first figure of merit for the first and second power amplifiers based on a loss of linearity relative to a predefined linearity requirement for the first and second power amplifiers. The method further includes receiving the input signal at the first and second power amplifiers to amplify into a wireless communication and characterizing the linearity of the first and second power amplifiers to satisfy a linearity requirement for the input signal while maintaining a desired output power level for the wireless communication.

BRIEF DESCRIPTION OF THE DRAWINGS

The invention may be understood by reference to the following description taken in conjunction with the accompanying drawings, in which like reference numerals identify like elements, and in which.

Figure 1:
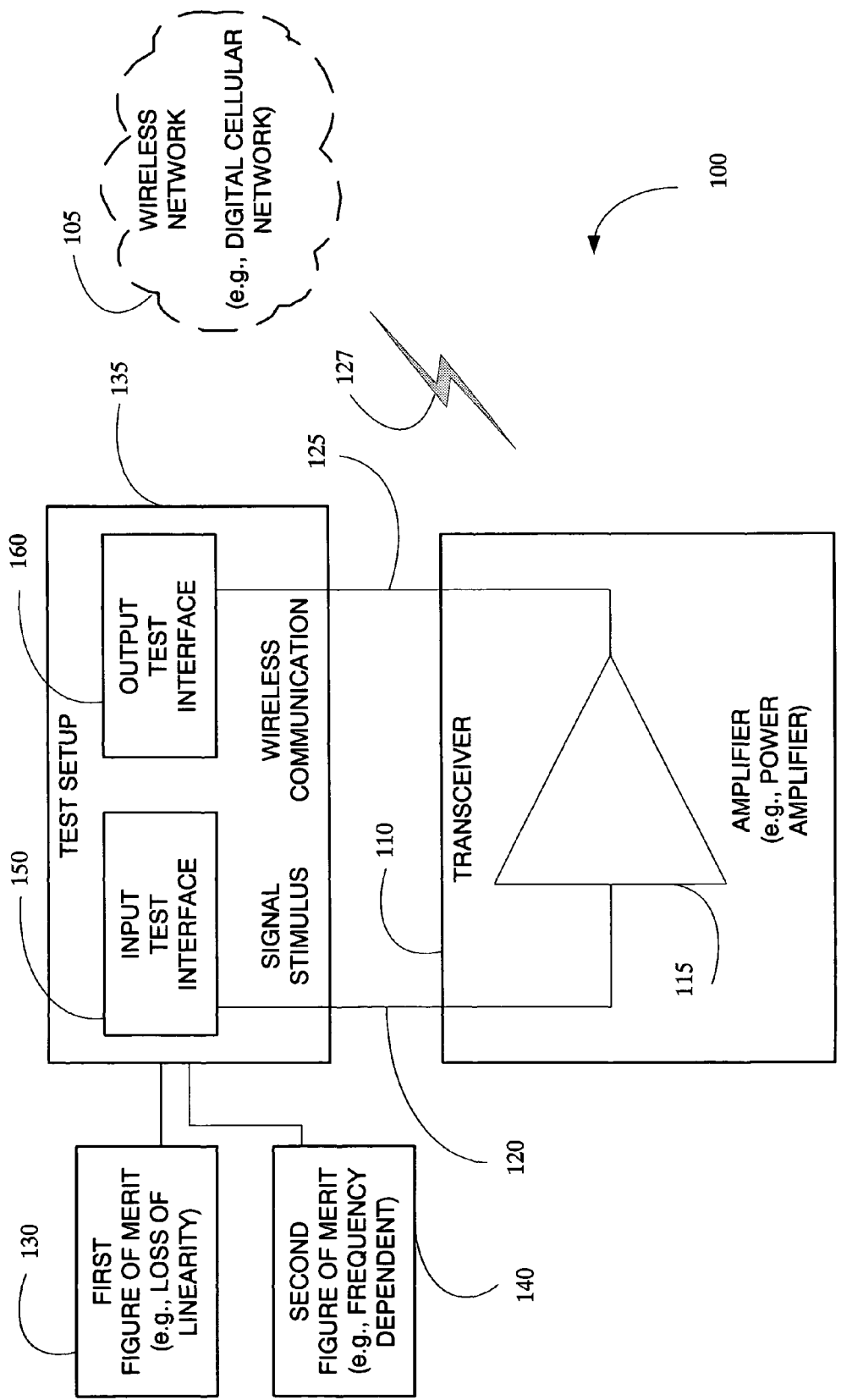
FIG. 1 illustrates a telecommunication system including a wireless network to communicate with a transceiver having a power amplifier that amplifies a complex modulated signal to provide a desired output power level for a wireless communication, wherein linearity of the power amplifier is characterized by a first figure of merit defined based on a loss of linearity relative to a predefined linearity requirement for the power amplifier according to one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Generally, a method may be used to describe a capability of an amplifier with respect to complex modulated signals, for example, characterizing linearity of an amplifier, such as a power amplifier. Using this method to describe an amplifier product, an amplifier supplier or vendor may specify the linearity of the amplifier product in a product documentation. Specifically, a first figure of merit may be defined, allowing a relatively improved performance estimation and comparison. The first figure of merit may be based on a loss of linearity (LoL) for a power amplifier, directly linking to a ratio of peak-power to an average-power (PAR) of a signal stimulus for which the power amplifier may be utilized and to a linearity requirement for the power amplifier. A second figure of merit may be defined based on the first figure of merit. These two defined figures of merit may characterize the linearity of a radio frequency (RF) power amplifier, as an example. The two defined figures of merit may be used to compare different amplifiers for higher modulation schemes, making possible a comparison of different amplifiers independent of their implementation technology or design structure.

Referring to FIG. 1, a telecommunication system 100 includes a wireless network 105 to communicate with a transceiver 110 having a power amplifier 115 that amplifies a signal stimulus 120, such as a complex modulated signal to provide a desired output power level for a wireless communication 125 according to one illustrative embodiment of the present invention. The telecommunication system 100 may be defined, at least in part, by a Third Generation (3G) mobile communication standard based on a Universal Mobile Telecommunications System (UMTS) protocol, in one embodiment. For example, the wireless communication 125 may operate according to a Code Division Multiple Access (CDMA) standard or a Global System for Mobile Communications (GSM) standard, which is a land mobile pan-European digital cellular radio communications system. In this way, the transceiver 110 may send or receive, voice, data, or a host of voice and data services in different generations of the wireless network 105, including a digital cellular network based on one or more standards including UMTS and 3G-1X (CDMA) 2000), as well as IS-95 CDMA, GSM and Time Division Multiple Access (TDMA).

In accordance with one embodiment, the power amplifier 115 may be a radio frequency (RF) amplifier defined, at least in part, based on a Code Division Multiple Access (CDMA) protocol standard in the wireless network 105, for example, a mobile communication or digital cellular network. Consistent with another embodiment, the power amplifier 115 may be an RF amplifier defined at least in part based on a Universal Mobile Telecommunication System (UMTS) protocol standard in the wireless network 105.

One purpose of the power amplifier 115 may be to deliver power to an antenna as efficiently as possible, preserving a maximum power transfer through amplification. For example, the power amplifier 115 may provide an amplification function for a mobile wireless device, such as a handset or a mobile station or a fixed wireless device, such as a base station in the telecommunication system 100, e.g., a digital wireless communication system. However, the signal level of the wireless communication 125 may be amplified enough to overcome inherent losses during the wireless transmission 127 so that it can be received by the mobile stations or the base station, or vice versa. The power amplifier 115 may deliver a high output power for the wireless transmission 127, which can be as low as 1 W and as high as hundreds of Watts, as two examples.

In one embodiment, the most efficient operation of the power amplifier 115 is near compression, which is an advantage of standards like GSM that employ a constant envelope modulation technique like Gaussian Minimum Shift Keying (GMSK). Such modulation techniques ensure that the envelope of a transmitted signal, i.e., the wireless communication 125, is constant. This enables the power amplifier 115 of the telecommunication system 100 to operate near saturation without distortion. On the other hand, other standards with more efficient data rates use modulation techniques like Binary Phase Shift Keying (BPSK), Quadrature Phase Shift Keying (QPSK), and Quadrature Amplitude Modulation (QAM). These high modulation techniques produce non-constant envelope signals, causing the power amplifier 115 to operate in the linear region, 3 to 6 dB backed off from compression.

Figure 3:
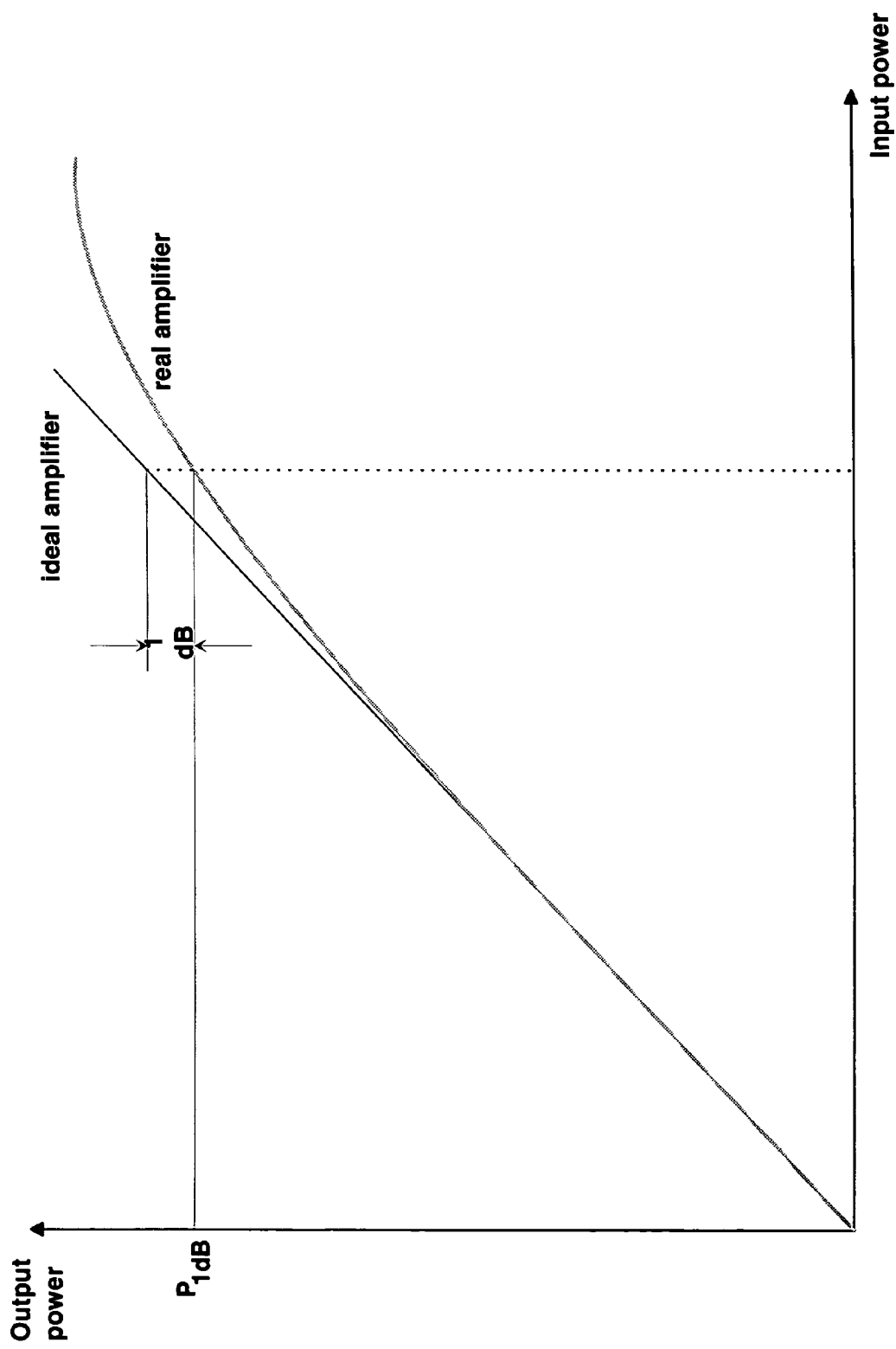
FIG. 3 depicts a typical characteristic of a radio frequency (RF) amplifier with $P_{1dB}$ compression point based on a prior art figure of merit to describe the behavior of the RF amplifier.
Figure 4:
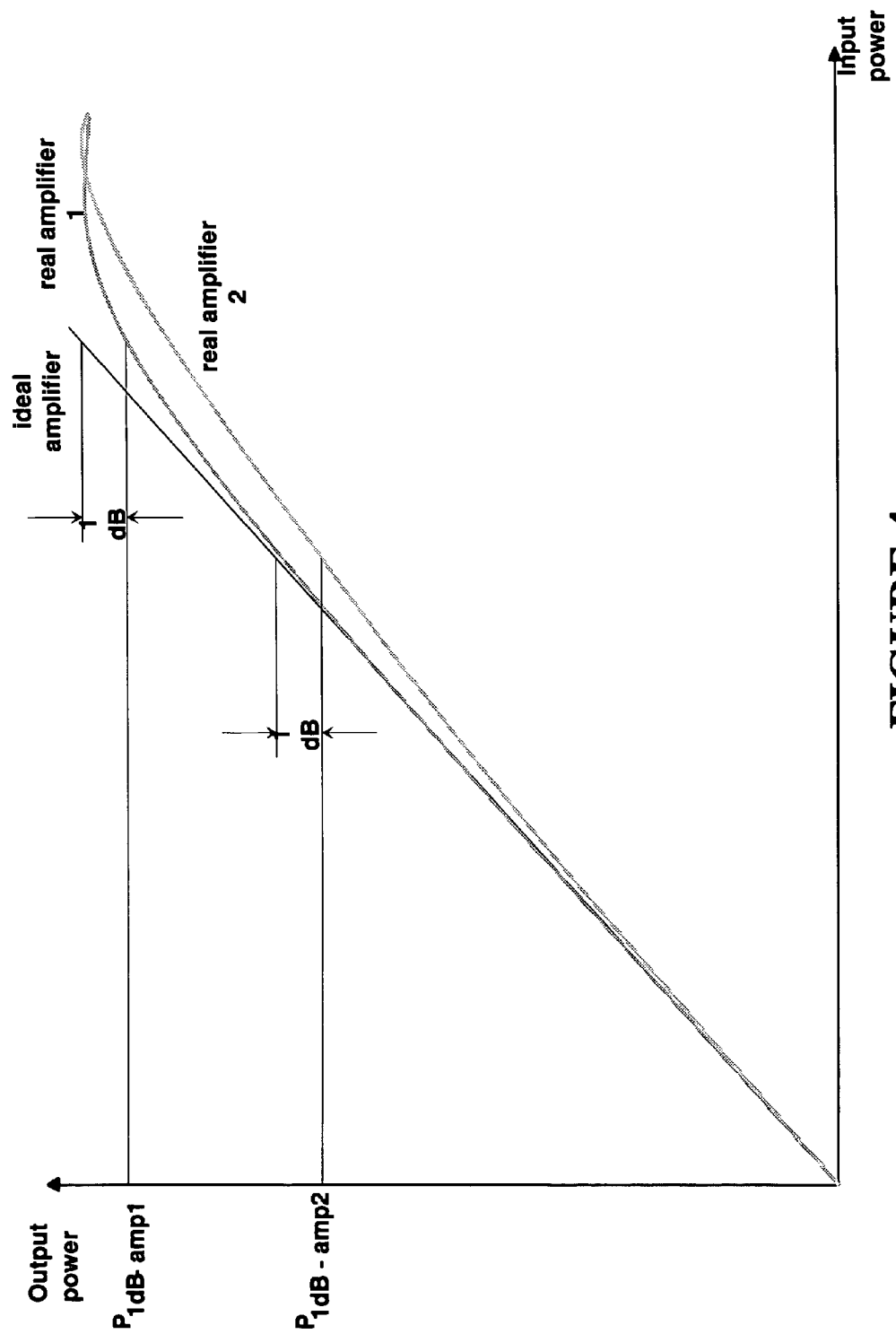
FIG. 4 depicts a conventional comparison of compression behavior of two different amplifiers.

Referring to FIG. 3, a relationship between an input and an output power of a typical power amplifier is shown. Likewise, in the 1 dB Compression point ($P_{1dB}$) figure for quantifying linearity, a non-linear response appears in the power amplifier 115 when the output signal level is driven to a point closer to saturation, as shown for the typical power amplifier in FIG. 3. Specifically, as the input signal level approaches this saturation point, the amplifier gain falls off, or compresses. The output 1 dB compression point is expressed as the output signal level at which the gain compresses by 1 dB from its linear value.

Turning back to FIG. 1, in one embodiment, the linearity of the power amplifier 115 may be characterized by a first figure of merit 130 defined based on a loss of linearity relative to a predefined linearity requirement for the power amplifier 115 by a test setup 135. The test setup 135 may assess a capability of an amplifier, such as the linearity of the power amplifier 115. The test setup 135 may define the first figure of merit 130 and a second figure of merit 140 dependent upon a minimum frequency within a predefined frequency band for the power amplifier 115 based on the first figure of merit 130. Specifically, the test setup 135 may link the first figure of merit 130 to a ratio of peak power to an average power of the signal stimulus 120 and to the predefined linearity requirement of the power amplifier 115.

The test setup 135 may comprise an input test interface 150 coupled to the power amplifier 115 to receive the signal stimulus 120 and an output test interface 160. The power amplifier 115 may be disposed in an apparatus, such as an integrated circuit including a transceiver, which may incorporate the test setup 135. In operation, the test setup 135 may apply the signal stimulus 120 to the power amplifier 115 to test the loss of linearity of the power amplifier 115, and in response to the signal stimulus 120, may measure the linearity of the power amplifier 115.

The performance of the transceiver 110 in mobile communications depends significantly on the performance of the power amplifier 115. A high linearity is one characteristic of a well-designed power amplifier, for example, a power amplifier for a wideband WCDMA (2.11-2.17 GHz) band without compromising on a predefined linearity requirement. Thus, the characterization of the linear and non-linear behavior of the power amplifier 115 may be achieved with stimulus response measurements using the test setup 135.

For example, different measurements may be obtained using the signal stimulus 120 that is swept over frequency or power. A vector network analyzer may be used to accomplish this using the test setup 135. In this case, both the input test interface 150 and the output test interface 160 may use a same instrument. However, certain measurements may use a separate source at the input test interface 150 to provide the signal stimulus 120 and a separate receiver at the output test interface 160. Digitally modulated signals may be used for channel power measurements. The receiver at the output test interface 160 for this type of measurement may be a spectrum analyzer or a vector signal analyzer. One or more power meters may be deployed in the test setup 135 to accurately measure the output power of the wireless communication 125.

In wireless mobile communications systems, such as the telecommunication system 100 a high power amplification of signals for transmission generally encounters a relatively large ratio of peak to average power (PAR). For example, in a time division multiple access (TDMA) system when multiple carrier signals are combined for amplification with the power amplifier 115, the resulting PAR is about 9-10 dB for a large number of carriers. In a code division multiple access (CDMA) system a single loaded 1.25 Mz wide carrier may have a PAR of 11.3 dB. If these signals are amplified fairly linearly, adjacent channel power (ACP) that can interfere with an adjacent frequency may be reduced.

Therefore, the power amplifier 115 may desire a high input signal level for the signal stimulus 120 and a high output signal level of the wireless communication 125 to characterize it under conditions substantially similar to actual or real world operation. To provide a high input power to the power amplifier 115 under test, a booster amplifier may be inserted in the input path of the test setup 135 to boost the signal stimulus 120 to a desired level. A power meter may be used to measure the input power level accurately and relay this information to a network analyzer in the test setup 135. To decrease the high output power level from the power amplifier 115 under test to a level that may be handled by the test setup 135, an external high power coupler or a high power attenuator may be installed at an output terminal of the power amplifier 115.

To make CDMA measurements on the power amplifier 115 that require a separate source and a receiver, the test setup 135 configuration shown in FIG. 1 may be used. In this case, a coupler may be deployed in the input test interface 150, which may enable a selective application of a CDMA signal to the power amplifier 115. Likewise, a divider in the output test interface 160 may enable analysis of an output signal, i.e., the wireless communication 125 on a variety of receivers such as a power meter, a spectrum analyzer, or a vector signal analyzer. The CDMA measurements made with this configuration of the test setup 135 include in-channel tests, such as output power and out-of-channel tests, such as harmonics and inter-modulation distortion.

To test the power amplifier 115 under real-world conditions, a signal generator in the input test interface may provide a realistic CDMA signal. The specification in IS-97 states that an appropriate signal for emulating real-world CDMA includes one pilot, one sync, and one paging channel and six traffic channels with specified power levels. Depending upon the data and specific traffic channels selected, the signal generator may provide the signal stimulus 120 with a crest factor of up to 14-15 dB.

In one embodiment, the test setup 135 may use a pulsed bias and/or a pulsed RF signal to test an unpackaged device, such as the power amplifier 115, allowing a study of the behavior of the power amplifier 115 when stimulated with a burst of RF energy. Use of a pulsed-RF signal stimulus may enable measurements with a high input power and a high output power, closely simulating the actual operating environment. For example, when making a power measurement on a CDMA signal, a spectrum analyzer using software implemented power detection may be used in the test setup 135. However, several measurements may be averaged, providing a true power averaging, using an external computer and/or a software program for an analyzer.

Figure 2:
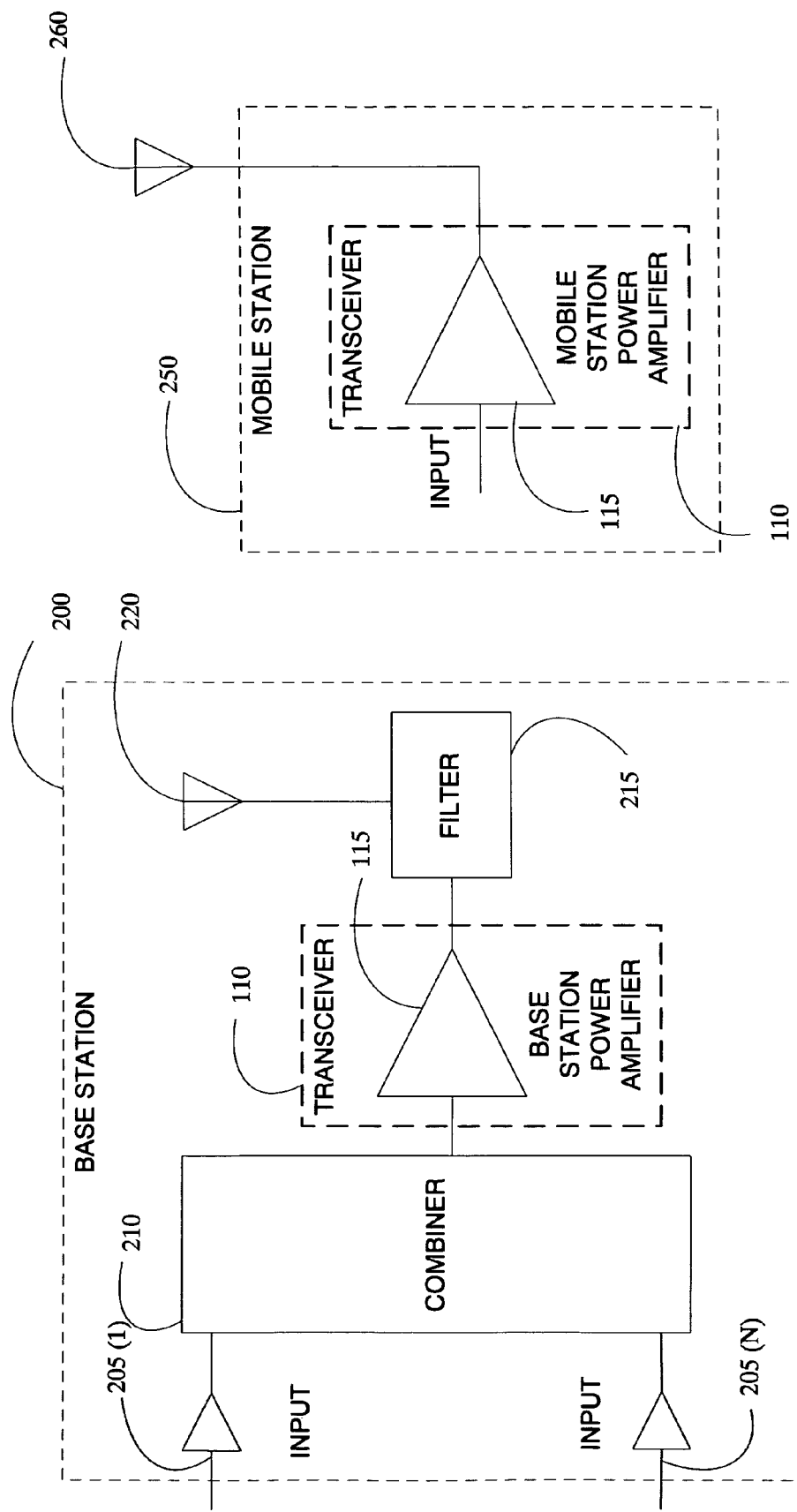
FIG. 2A illustrates a base station with the power amplifier shown in FIG. 1 consistent with one embodiment of the present invention.
FIG. 2B illustrates a mobile station with the power amplifier shown in FIG. 1 consistent with one embodiment of the present invention.

Referring to FIG. 2A, a base station 200 may include the power amplifier 115 shown in FIG. 1 consistent with one embodiment of the present invention. The transceiver 110 shown in FIG. 1 including the power amplifier 115 may be disposed in the base station 200, which may be associated with the telecommunication system 100 shown in FIG. 1. The base station 200 may include a plurality of input ports 205 (1-N) combined by a combiner 210 for the transceiver 110 for conventional signal processing. The transceiver 110 of the base station 200 may further be coupled to a filter 215, such as a bandpass filter. An antenna 220 may be coupled to the filter 215 to transmit and/or receive wireless communications at the base station 200.

Referring to FIG. 2B, a mobile station 250 may include the power amplifier 115 shown in FIG. 1 consistent with one embodiment of the present invention. The transceiver 110 shown in FIG. 1 including the power amplifier 115 may be disposed in the mobile station 250, which may be associated with the telecommunication system 100. The mobile station 250 may include an input port 255 for the transceiver 110 for conventional signal processing. An antenna 260 may be coupled to the transceiver 110 to transmit and/or receive wireless communications at the mobile station 250.

Figure 5:
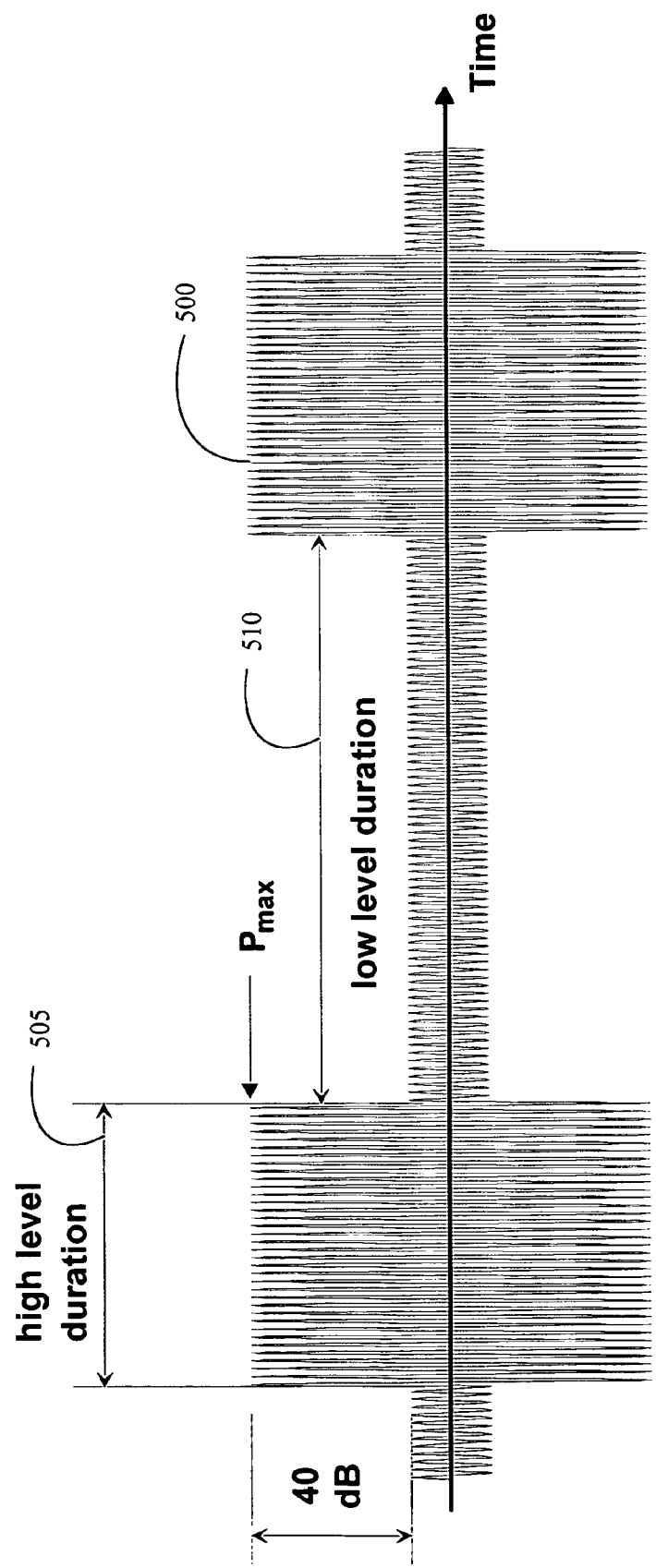
FIG. 5 depicts a test signal stimulus for measuring the absolute maximum output power of the power amplifier shown in FIG. 1 according to one illustrative embodiment of the present invention.

Referring to FIG. 5, a test signal 500 for the signal stimulus 120 for measuring the absolute maximum output power of the power amplifier 115 shown in FIG. 1 is defined according to one illustrative embodiment of the present invention. The test signal 500 may be used by the test setup 135 shown in FIG. 1 to characterize the linearity of the power amplifier 115. According to one embodiment, this test signal 500 shown in FIG. 5 is a pulsed RF signal. To measure the linearity of the power amplifier 115, the test setup 135 may use an amplitude of the signal stimulus 120, i.e., the test signal 500 during a high level phase 505 as a maximum power value in a first measurement.

In operation, to obtain the first figure of merit 130, as shown in FIG. 1, the test setup 135 measures an absolute maximum of the output power ($P_{max}$). To provide a comparable signal condition to a real world signal, the test signal 500 may be used to measure this absolute maximum of the output power. The amplitude of the test signal 500 during the high level phase 505 may be used as a maximum power value. The amplitude in a low level phase 510 is 40 dB below. While the duration of the high level phase 505 may be determined by an ideal measurement time, and shall be in the range of some transmit symbols, the duration of the low level phase 510 may be determined to derive a peak-to-average power ratio (PAR) of the test signal 500 for which the power amplifier 115 will be used for (e.g. using a UMTS Signal Test Model 1 with PAR=10.2 dB).

Figure 6:
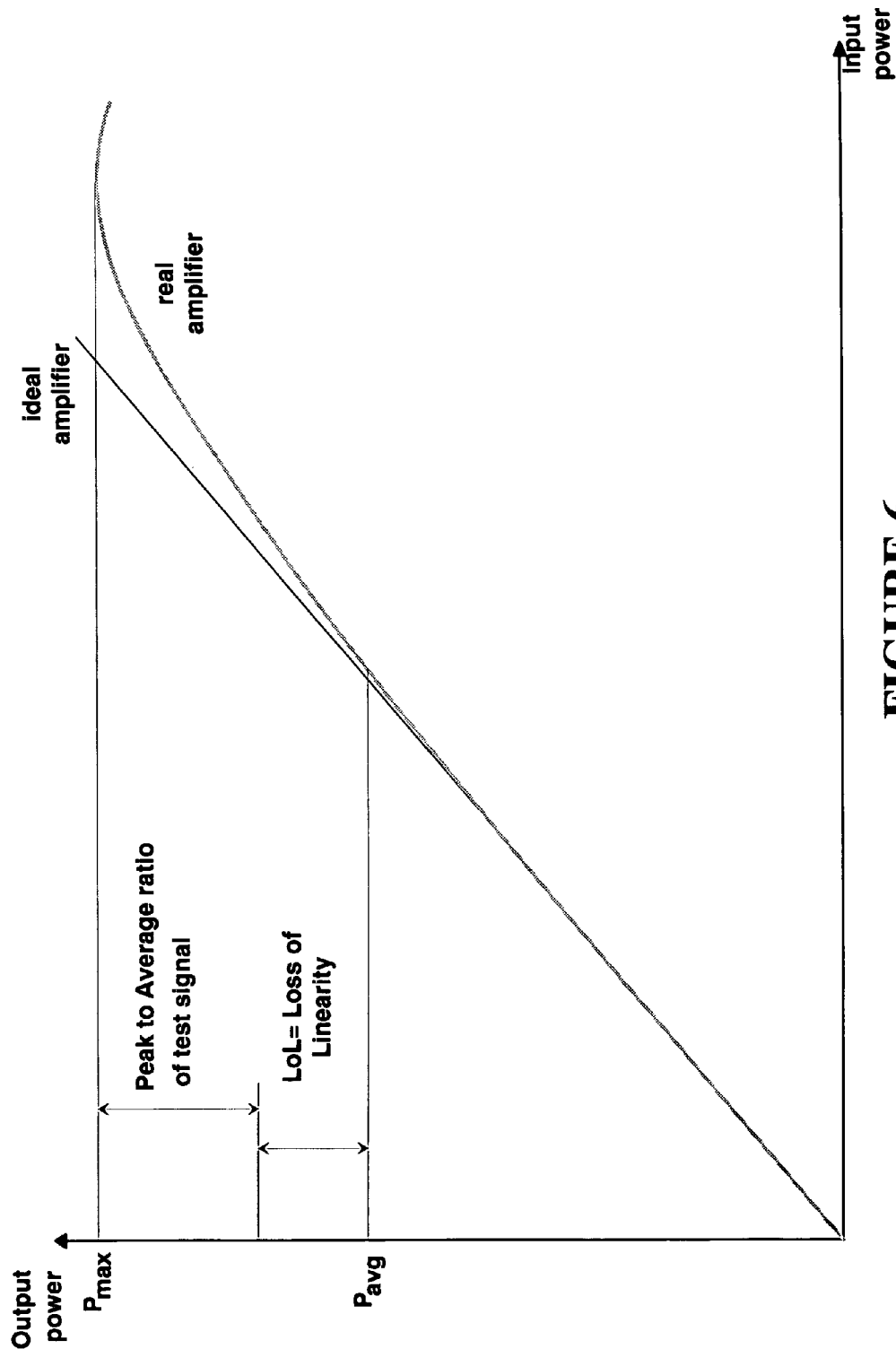
FIG. 6 depicts the first figure of merit defined based on a loss of linearity relative to a predefined linearity requirement for the power amplifier shown in FIG. 1 according to one illustrative embodiment of the present invention.

Referring to FIG. 6, the first figure of merit 130 defined based on a loss of linearity relative to a predefined linearity requirement for the power amplifier 115 shown in FIG. 1 is depicted according to one illustrative embodiment of the present invention. After determination of the $P_{max}$, as shown in FIG. 5, a second measurement may be performed using a real world signal (e.g. UMTS Signal Test Model 1). The amplitude of this real world signal may be selected in such a way that desired linearity requirements for the real world signal are fulfilled, maintaining a highest possible output power level. To measure the linearity of the power amplifier 115, the test setup 135 may apply as an input, the test signal 500 substantially matching a real world signal to the power amplifier. In this manner, a long time average of this real world signal, i.e., the test signal 500 may be measured in a second measurement.

According to one embodiment, the first figure of merit 130 may be defined as: LoL (dB)=$P_{max}$(dBm)−PAR(dB)−$P_{avg}$ (dBm), as shown in FIG. 6. The LoL figure describes the additional power backoff (APBO) besides the PAR of the real world signal needed to meet the linearity requirements for the maximum output power. As can be seen in FIG. 6, the lower the LoL figure is the higher is the linearity of the power amplifier 115.

With the first figure of merit 130, an additional figure of merit, the second figure of merit 140, may be defined as:

$$f_m = \frac{g \cdot \mu_{PAE}}{LoL}.$$

Here the symbol g represents the gain of the power amplifier 115 and the symbol $\mu_{PAE}$ describes the power added efficiency (PAE). Both the symbols g and $\mu_{PAE}$ may be measured with the real world signal as the test signal 500 and at the power level of $P_{avg}$, as shown in FIG. 6. The second figure of merit 140 may be frequency dependent. To compare different amplifiers, a minimum of the second figure of merit 140 in a defined frequency band may be used.

Therefore, the first and second measurements may ideally need a more complex signal stimulus than a simple CW frequency. For example, a code division multiple access (CDMA) signal may be needed for accurately characterizing an output channel power, occupied bandwidth, and distortion performance of the power amplifier 115. Likewise, distortion measurements may also be performed for characterizing the power amplifier's 115 linearity.

Figure 7:
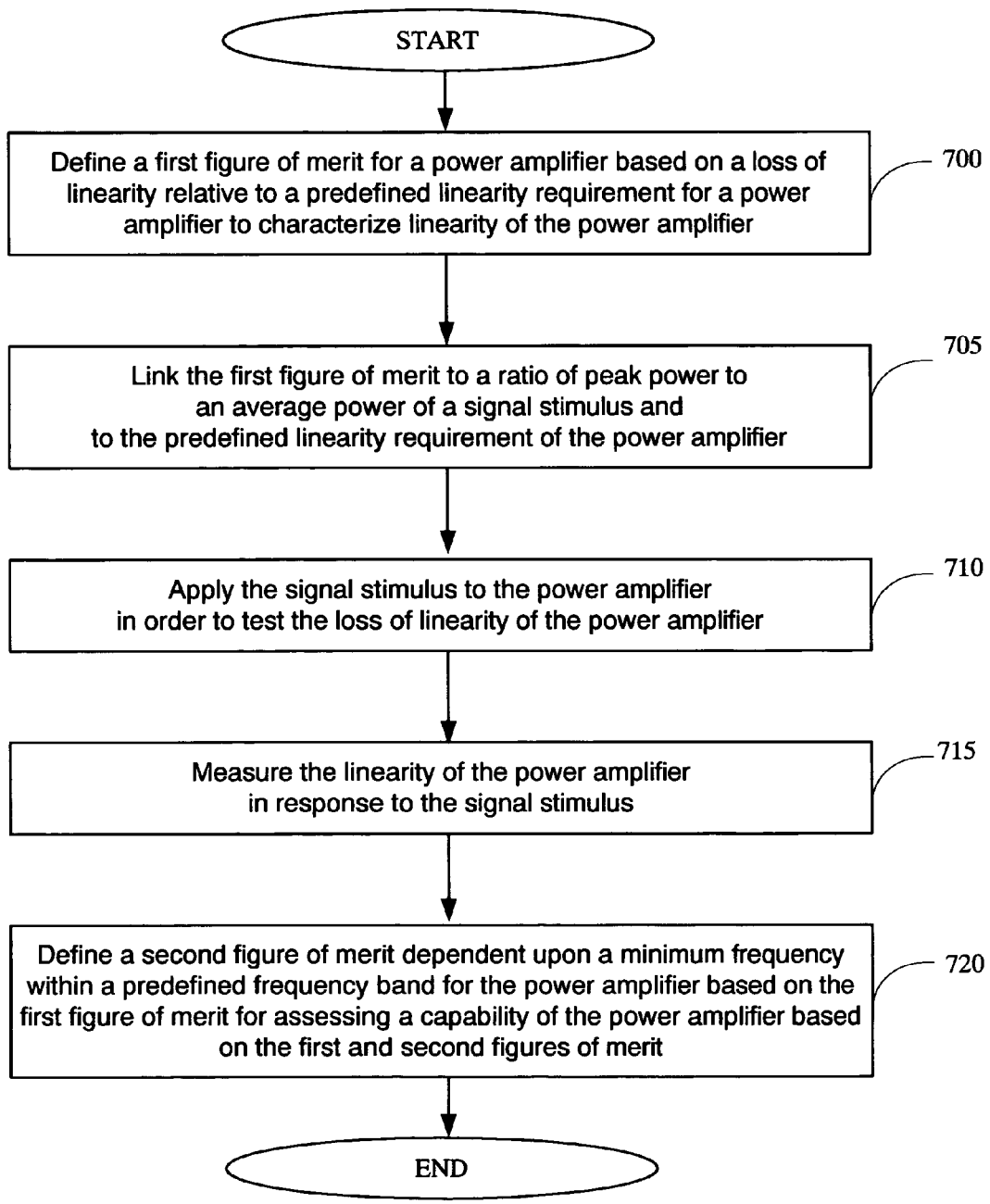
FIG. 7 illustrates a stylized representation of a method for assessing a capability of an amplifier, such as the power amplifier shown in FIG. 1 based on a first and a second figures of merit that characterize linearity of the power amplifier according to one illustrative embodiment of the present invention.

Referring to FIG. 7, a stylized representation of a method for assessing a capability of an amplifier, such as the power amplifier 115 shown in FIG. 1, is illustrated based on the first figure of merit 130 and the second figure of merit 140 that both characterize the linearity of the power amplifier 115, according to one illustrative embodiment of the present invention. At block 700, to assess, define, represent or specify a capability of the power amplifier 115, the first figure of merit 130 may be defined based on the LoL figure shown in FIG. 6 relative to a predefined linearity requirement for the power amplifier 115, characterizing linearity of the same. The first figure of merit 130 may be linked to a ratio of a peak-power to an average-power (PAR) of the signal stimulus 120 and to the predefined linearity requirement of the power amplifier 115, as indicated in block 705.

To test or obtain the LoL figure of the power amplifier 115, at block 710, the test setup 135 may use the input test interface 150 to apply the signal stimulus 120 to the power amplifier 115. In response to the signal stimulus 120, the test setup 135 may use the output test interface 160 to measure the linearity of the power amplifier 115, as shown in block 715. The signal stimulus 120 may be used to measure an absolute maximum of an output power of the power amplifier 115. For example, a pulsed radio frequency signal as an amplifier input signal to power amplifier 115 may be used. The amplifier input signal may be modulated using a higher modulation scheme. The modulated amplifier input signal may be received at the power amplifier 115 to amplify the same into the wireless communication 125. A linearity requirement for the modulated amplifier input signal may be satisfied while maintaining a desired output power level for the wireless communication 125.

An amplitude of the signal stimulus 120 during the high level phase 505 as a maximum power value may be used in a first measurement. A duration of the low level phase 510 may be determined to derive a ratio of a peak-power to an average-power (PAR) of the signal stimulus 120. The test signal 500 substantially matching a real world signal may be applied to the power amplifier 115 to measure a long time average of the test signal 500 in a second measurement. However, the amplitude of the test signal 500 may be selected in such a way that a linearity requirement for the real world signal maintains a desired output power level. Using the test setup 135, the second figure of merit 140 may be defined being dependent upon a minimum frequency within a predefined frequency band for the power amplifier 115 based on the first figure of merit 130, as depicted in block 720.

Figure 8:
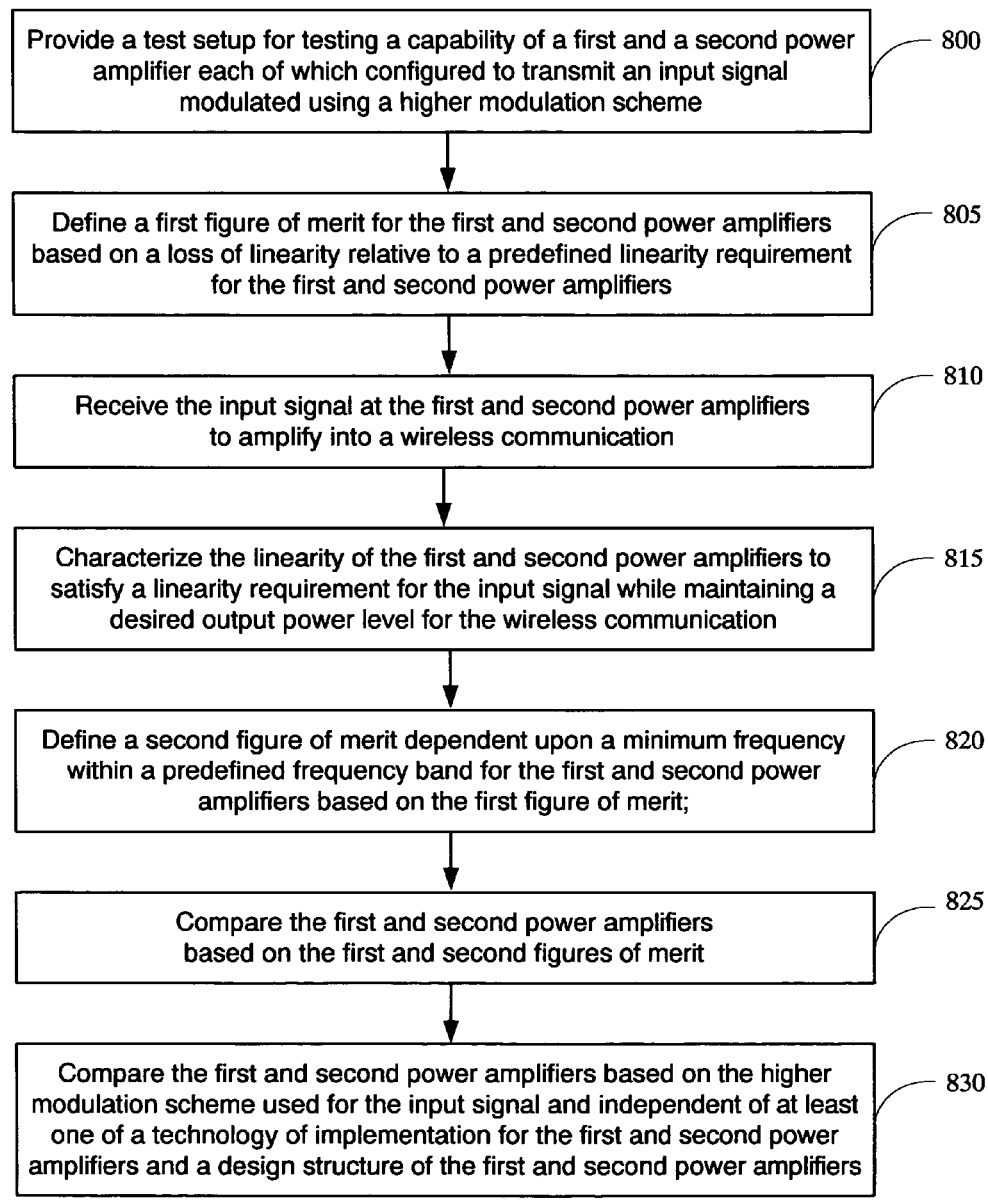
FIG. 8 illustrates a stylized representation of a method for testing a capability of a first and a second power amplifier each of which configured to transmit an input signal modulated using a higher modulation scheme, wherein the method compares the first and second power amplifiers based on the first and second figures of merit in accordance with one embodiment of the present invention.

Referring to FIG. 8, a stylized representation of a method for testing a capability of a first and a second power amplifier, such as the power amplifier 115 shown in FIG. 1, is illustrated to compare the first and second power amplifiers based on the first figure of merit 130 and the second figure of merit 140, in accordance with one embodiment of the present invention. At block 800, the test setup 135 may be provided to characterize the linearity of the first and second power amplifiers each of which may be configured to transmit an input signal modulated using a higher modulation scheme.

The first figure of merit 130 may be defined for the first and second power amplifiers based on a loss of linearity (LoL) figure relative to a predefined linearity requirement associated with the first and second power amplifiers, as indicated in block 805. At block 810, the test signal 500 may be received at the corresponding inputs of the first and second amplifiers as the signal stimulus 120 to amplify the same into the wireless communication 125. In this manner, the linearity of the first and second power amplifiers may be characterized to satisfy a linearity requirement for the test signal 500 while maintaining a desired output power level for the wireless communication 125, as shown in block 815.

At block 820, the second figure of merit 140 may be defined dependent upon a minimum frequency within a predefined frequency band for the first and second power amplifiers based on the first figure of merit 130. The first and second power amplifiers may be compared based on the first and second figures of merit, 130 and 140, at block 825. In one embodiment, the first and second power amplifiers may be compared based on the higher modulation scheme used for the test signal 500 and independent of at least one of a technology of implementation for the first and second power amplifiers and a design structure of the same, as depicted in block 830. Advantageously, by including such figures of merit in a datasheet of an amplifier, precise information about the capability of the amplifier transmitting a complex modulated signal may be provided.

While the invention has been illustrated herein as being useful in a telecommunications network environment, it also has application in other connected environments. For example, two or more of the devices described above may be coupled together via device-to-device connections, such as by hard cabling, radio frequency signals (e.g., 802.11(a), 802.11(b), 802.11(g), Bluetooth, or the like), infrared coupling, telephone lines and modems, or the like. The present invention may have application in any environment where two or more users are interconnected and capable of communicating with one another.

Those skilled in the art will appreciate that the various system layers, routines, or modules illustrated in the various embodiments herein may be executable control units. The control units may include a microprocessor, a microcontroller, a digital signal processor, a processor card (including one or more microprocessors or controllers), or other control or computing devices as well as executable instructions contained within one or more storage devices. The storage devices may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions, when executed by a respective control unit, causes the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method for assessing a capability of an amplifier, the method comprising:
defining a first figure of merit for a power amplifier based on a loss of linearity relative to a predefined linearity requirement for said power amplifier to characterize linearity of said power amplifier;
applying a signal stimulus to said power amplifier to test a loss of linearity of said power amplifier; and
measuring the linearity of said power amplifier in response to said signal stimulus to compare said power amplifier with another power amplifier based on the first figure of merit.

2. A method, as set forth in claim 1,
wherein defining said first figure of merit comprises defining said first figure of merit as a function of a ratio of a peak-power to an average-power of the signal stimulus and to the predefined linearity requirement of said power amplifier.

3. A method, as set forth in claim 2, further comprising:
defining a second figure of merit dependent upon a minimum frequency within a predefined frequency band for said power amplifier based on said first figure of merit.

4. A method, as set forth in claim 2, further comprising:
measuring an absolute maximum of an output power of said power amplifier using the signal stimulus.

5. A method, as set forth in claim 4, wherein using the signal stimulus further comprising:
applying a pulsed radio frequency signal as an amplifier input signal to said power amplifier.

6. A method, as set forth in claim 5, wherein using a pulsed radio frequency signal further comprising:
modulating the amplifier input signal using a modulation scheme that forms a non-constant envelope of the modulated amplifier input signal; and
receiving the modulated amplifier input signal at said power amplifier to amplify into a wireless communication; and
generating a desired output power level for the wireless communication that satisfies a linearity requirement for the modulated amplifier input signal.

7. A method, as set forth in claim 2, wherein measuring the linearity of said power amplifier comprises measuring the linearity of said power amplifier assuming that an amplitude of the signal stimulus during a high level phase corresponds to a maximum power value in a first measurement.

8. A method, as set forth in claim 2, wherein measuring the linearity of said power amplifier further comprising:
determining a duration of a low level phase to derive a ratio of peak power to an average power of the signal stimulus.

9. A method, as set forth in claim 7, wherein measuring the linearity of said power amplifier further comprising:
applying an input test signal substantially matching a real world signal to said power amplifier; and
measuring a long time average of the input test signal to said power amplifier in a second measurement.

10. A method, as set forth in claim 9, wherein applying an input test signal to said power amplifier comprises applying an input test signal having an amplitude selected to provide a highest possible output power level and to fulfill a linearity requirement for the real world signal.

11. An apparatus comprising:
a test setup to assess a capability of an amplifier; and
a power amplifier coupled to said test setup, wherein said test setup defines a first figure of merit for said power amplifier based on a loss of linearity relative to a predefined linearity requirement for said power amplifier to characterize linearity of said power amplifier and said power amplifier amplifies a complex modulated signal for a wireless communication, applies a signal stimulus to said power amplifier to test a loss of linearity of said power amplifier, and measures the linearity of said power amplifier in response to said signal stimulus to compare said power amplifier with another power amplifier based on the first figure of merit.

12. An apparatus, as set forth in claim 11, wherein said test setup links said first figure of merit to a ratio of a peak-power to an average-power of the signal stimulus and to the predefined linearity requirement of said power amplifier and defines a second figure of merit dependent upon a minimum frequency within a predefined frequency band for said power amplifier based on said first figure of merit.

13. An apparatus, as set forth in claim 11, wherein said power amplifier is a radio frequency amplifier defined at least in part based on a Code Division Multiple Access protocol standard in a mobile communication network.

14. An apparatus, as set forth in claim 11, wherein said power amplifier is a radio frequency amplifier defined at least in part based on a Universal Mobile Telecommunication System protocol standard in a mobile communication network.

15. An apparatus, as set forth in claim 11, wherein said power amplifier is disposed in a mobile station associated with a telecommunication system.

16. An apparatus, as set forth in claim 11, wherein said power amplifier is disposed in a base station associated with a telecommunication system.

17. An amplifier that amplifies a complex modulated signal to provide a desired output power level for a wireless communication, said amplifier comprising:
an input test interface coupled to said amplifier to receive a signal stimulus to test a loss of linearity of said amplifier; and
an output test interface coupled to said amplifier to measure the linearity of said amplifier in response to said signal stimulus to compare said amplifier with another amplifier based on the loss of linearity of said amplifier.

18. An amplifier, as set forth in claim 17, wherein said input test interface defines a first figure of merit for said amplifier based on the loss of linearity relative to a predefined linearity requirement for said amplifier.

19. An amplifier, as set forth in claim 17, wherein said output test interface characterizes linearity of said amplifier based on said first figure of merit for said amplifier.

20. An amplifier, as set forth in claim 17, wherein said input test interface links said first figure of merit to a ratio of peak power to an average power of the signal stimulus and to the predefined linearity requirement of said amplifier and defines a second figure of merit dependent upon a minimum frequency within a predefined frequency band for said amplifier based on said first figure of merit.

21. An amplifier, as set forth in claim 17, wherein said amplifier is a radio frequency amplifier defined at least in part based on a Code Division Multiple Access protocol standard in a mobile communication network.

22. An amplifier, as set forth in claim 17, wherein said amplifier is a radio frequency amplifier defined at least in part based on a Universal Mobile Telecommunication System protocol standard in a mobile communication network.

23. An amplifier, as set forth in claim 17, wherein said amplifier is disposed in a mobile station associated with a telecommunication system.

24. An amplifier, as set forth in claim 17, wherein said amplifier is disposed in a base station associated with a telecommunication system.

25. A telecommunication system comprising:
 a transceiver having a power amplifier that amplifies a complex modulated signal to provide a desired output power level for a wireless communication, wherein for said power amplifier a first figure of merit is defined based on a loss of linearity relative to a predefined linearity requirement for said power amplifier to characterize linearity of said power amplifier, the power amplifier being configured to receive a signal stimulus that can be applied to said power amplifier to test a loss of linearity of said power amplifier, and the linearity of said power amplifier can be measured in response to said signal stimulus to compare said power amplifier with another power amplifier based on the first figure of merit.

26. A telecommunication system, as set forth in claim 25, wherein said power amplifier is disposed in a mobile station associated with a digital cellular network.

27. A telecommunication system, as set forth in claim 25, wherein said power amplifier is disposed in a base station associated with a digital cellular network.

28. A method for testing a capability of a first and a second power amplifier each of which configured to transmit an input signal modulated using a higher modulation scheme, the method comprising:
 defining a first figure of merit for said first and second power amplifiers based on a loss of linearity relative to a predefined linearity requirement for said first and second power amplifiers;
 receiving the input signal at said first and second power amplifiers to amplify into a wireless communication; and
 characterizing the linearity of said first and second power amplifiers to satisfy a linearity requirement for the input signal while maintaining a desired output power level for the wireless communication.

29. A method, as set forth in claim 28, further comprising:
 defining a second figure of merit dependent upon a minimum frequency within a predefined frequency band for said first and second power amplifiers based on said first figure of merit; and
 comparing said first and second power amplifiers based on said first and second figures of merit.

30. A method, as set forth in claim 29, wherein comparing said first and second power amplifiers further comprising:
 comparing said first and second power amplifiers based on said higher modulation scheme used for the input signal and independent of at least one of a technology of implementation for said first and second power amplifiers and a design structure of said first and second power amplifiers.

* * * * *